United States Patent
Sekine et al.

(10) Patent No.: US 6,934,557 B2
(45) Date of Patent: Aug. 23, 2005

(54) PORTABLE TYPE RADIO EQUIPMENT

(75) Inventors: Shu-ichi Sekine, Yokohama (JP); Takayoshi Itoh, Yokohama (JP); Yuji Iseki, Kawasaki (JP); Naoko Ono, Tokyo (JP); Keiichi Yamaguchi, Kawasaki (JP); Hiroyuki Kayano, Fujisawa (JP); Akihiro Tsujimura, Yokohama (JP); Kazuhiro Inoue, Inagi (JP); Noriaki Odachi, Yokohama (JP); Yasushi Murakami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 385 days.

(21) Appl. No.: 10/256,080

(22) Filed: Sep. 27, 2002

(65) Prior Publication Data

US 2003/0060227 A1 Mar. 27, 2003

(30) Foreign Application Priority Data

Sep. 27, 2001 (JP) .......................... 2001-295363

(51) Int. Cl.$^7$ ............................... H04M 1/00
(52) U.S. Cl. ................. 455/550.1; 455/73; 455/107; 455/121; 330/129
(58) Field of Search .................. 455/105–107, 455/129, 121, 115, 1, 73, 69, 125, 127, 126, 550.1, 115.5, 127.1, 522.1, 80, 82; 333/17.1, 17.3; 330/51, 129, 207, 130, 149, 151

(56) References Cited

U.S. PATENT DOCUMENTS

| | | | |
|---|---|---|---|
| 4,965,607 A | | 10/1990 | Wilkins et al. |
| 5,276,912 A | * | 1/1994 | Siwiak et al. .................. 455/73 |
| 5,408,691 A | * | 4/1995 | Takao ....................... 455/127.1 |
| 5,491,715 A | * | 2/1996 | Flaxl ............................ 375/344 |
| 5,548,827 A | | 8/1996 | Hanawa et al. |
| 5,564,086 A | | 10/1996 | Cygan et al. |
| 5,862,458 A | * | 1/1999 | Ishii ........................... 455/107 |
| 6,212,367 B1 | * | 4/2001 | Tolson ...................... 455/114.2 |
| 6,339,711 B1 | | 1/2002 | Otaka et al. |
| 6,538,506 B2 | * | 3/2003 | Hareyama .................... 330/51 |
| 6,710,651 B2 | * | 3/2004 | Forrester .................... 330/129 |

FOREIGN PATENT DOCUMENTS

| | | | |
|---|---|---|---|
| EP | 0 404 150 | 12/1990 | |
| EP | 0 459 440 | 12/1991 | |
| EP | 1 093 222 | 4/2001 | |
| JP | 10-341117 | 12/1998 | |
| JP | 2001-16044 | 1/2001 | |
| JP | 2001-016044 A | * 1/2001 | ............. H03F/1/02 |

* cited by examiner

Primary Examiner—Charles N. Appiah
(74) Attorney, Agent, or Firm—Oblon, Spivak, McClelland, Maier & Neustadt, P.C.

(57) ABSTRACT

In a radio equipment of portable type, the impedance of an antenna is optimized by adjusting a matching circuit which has the adjustment function and is connected to an antenna, based on a reflection phase sent back from the antenna, outputted from a reflection phase detector, and a current supplied to a transmitter-receiver which generates a transmitting signal.

23 Claims, 7 Drawing Sheets

PORTABLE TYPE RADIO EQUIPMENT

CROSS-REFERENCE TO RELATED APPLICATIONS

This application is based upon and claims the benefit of priority from the prior Japanese Patent Application No. 2001-295363, filed Sep. 27, 2001, the entire contents of which are incorporated herein by reference.

BACKGROUND OF THE INVENTION

1. Field of the Invention

The present invention relates to a radio equipment of portable type, particularly to a radio equipment of portable type made in one unit with an antenna and capable of reducing the influence of the things around the antenna upon the characteristics of the antenna.

2. Description of the Related Art

Recently, a radio equipment or terminal of portable type has become thinner and more compact. A radio equipment of portable type should be at present very easy to carry with. Therefore, thin and compactness of the equipment is very important features.

On the other hand, there is a problem that a human body affects an antenna mounted on radio equipment. A human body absorbs and scatters a radio wave of the frequency used in the radio equipment of portable type. Further, a human body fluctuates the antenna impedance used nearby. Generally, in respect of a high frequency band, a human body acts as dielectric media with a permittivity of 50 or higher. Consequently, a human body deteriorates the radiation characteristics of an antenna.

In addition, as the radio equipment of portable type becomes thin and compact, an antenna is positioned closer to the ear of the equipment user. This closer distance to the ear makes deterioration of the antenna characteristics more serious.

The inventors of the present invention measured the influence of a human body on the deterioration of the antenna characteristics, and obtained the results as shown in FIG. 1. The experiment used a radio equipment of portable type of 2 GHz and measured the influence of a human body on the antenna. FIG. 1 shows the deterioration of the antenna gain caused by the impedance fluctuation while the radio equipment is being operated, taking the equipment thickness as a parameter. As seen from FIG. 1, when the equipment thickness becomes thinner than 20 mm, the possibility of contacting the ear to the antenna increases, and when the antenna comes in contact with the ear, the antenna gain is largely deteriorated.

As mentioned above, the cause of this deterioration is the fluctuation in the antenna impedance due to the influence of a human body. A-human body has a very high dielectric constant. Thus, when the antenna is approached to a human body, the electrical length of the antenna is regarded as to be equivalently long. In this case, the antenna resonance frequency deviates from a desired value, and the antenna impedance changes accordingly.

Therefore, even if the antenna impedance is adjusted to the optimum level in the radio equipment of portable type itself, the antenna impedance will shift from the optimum value when it is brought close to a human body.

Further, when the antenna impedance is deteriorated, the transmission power of the radio equipment of portable type may be lowered. This problem will be explained hereinafter.

To radiate a radio wave from an antenna, the antenna must be powered first of all. The optimum condition to power the antenna is that the impedance of a feed line is the same value as the impedance of that antenna.

When the antenna impedance changes from the optimum value, the power supplied through the feed line is reflected by the input end of the antenna and returned to a transmitting amplifier. Therefore, the power outputted from the amplifier to the antenna is reduced.

Moreover, the reflected power deteriorates the amplifier performance, such as gain and operation efficiency, and causes deterioration of the transmission performance of the radio equipment itself.

As a means of solving this problem, a method of examining the reflection coefficient between the amplifier and antenna has been proposed. This proposal includes the power amplifier disclosed by Jpn. Pat. Appln. KOKAI Publication No. 10-341117. This conventional power amplifier detects the current consumption in the power amplifier and the power reflected by an antenna, and supplies these detected signals to the control circuit. This control circuit sends a control signal to a variable phase snifter based on the both detected signals, and corrects phase shifts occurred between the power amplifier and antenna.

Since this prior art power amplifier corrects only phase shifts, the evaluation quantity changing range is narrow and the phase shifts can be corrected by measuring the evaluation quantities. However, if a shift has two vectors, that is, the phase and amplitude directions of a reflection coefficient, as in the antenna of a cellular phone, the correction becomes difficult by only the above two evaluation quantities. Moreover, the antenna impedance must be checked even while communication is not made. Otherwise, communication has to be started in bad conditions, causing a communication failure. In the radio equipment of portable type, it is resulted from the high probability of changing the surrounding conditions upon start of communication. For example, when a call comes in standby mode, a mobile terminal is taken out from a pocket, held by hand, set to conversation mode, and attached to a head. The conditions around the antenna are changed three times in a very short time.

The above-mentioned conventional method can check the impedance only while communication is being made in some types of the system. In the CDMA system, for example, only an incoming call can be accepted in standby mode, and the above-mentioned operation is impossible. Sending a radio wave unnecessarily except when making communication causes troubles in other systems, and is controlled by the Radio Law.

As explained above, there is a problem in the conventional radio equipment of portable type. Antenna characteristics are deteriorated by bad matching between a transmitter and an antenna, caused by the surrounding conditions, particularly coming close to a human body.

BRIEF SUMMARY OF THE INVENTION

An object of the present invention is to provide a radio equipment of portable type capable of making good communication, which has a circuit configuration matched with an antenna without an influence of an ambience around the antenna.

According to an aspect of the invention, there is provided a radio communication equipment comprising;

a power supply configured to supply an electric power;

a transmitting circuit configured to generate a transmitting signal, which is energized by the power supply;

a power detection circuit configured to detect the electric power supplied to the transmitting-circuit and generate a power detection signal;

an antenna, having an antenna impedance, to which the transmitting signal is supplied, and which generates an antenna reflection signal having a certain phase depending on the transmitting signal;

an impedance matching circuit, having a variable impedance, configured to adjust the variable impedance to match the antenna with the transmitting circuit;

a phase detection circuit configured to detect the phase of the antenna reflection signal from the antenna to generate a phase detection signal;

a selecting circuit configure to select one of the phase detection circuit and the transmitting-circuit and connect the selected one of the phase detection circuit and the transmitting-circuit to the antenna; and a control circuit configured to controls the selecting circuit to receive the phase detection signal and the power detection signal, and control the impedance matching circuit to set the variable impedance depending on the phase detection signal and the power detection signal.

According to another aspect of the invention, there is provided a radio communication equipment comprising;

a power supply configured to supply an electric power;

a first transmitting circuit configured to generate a first transmitting signal, which is energized by the power supply;

a power detection circuit configured to detect the electric power supplied to the first transmitting circuit and generate a power detection signal;

an antenna, having an antenna impedance, to which a first transmitting signal is supplied;

an impedance matching circuit configured to adjust the antenna impedance to match the antenna with the first transmitting circuit;

a phase detection circuit, including;

a second transmitting circuit configured to generate a second transmitting signal having a first phase, and supply the second transmitting signal to the antenna, the antenna generating an antenna reflection signal having a second phase depending on the second transmitting signal:

a receiving circuit configured to receive the second transmitting signal from the second transmitting circuit and the antenna reflection signal from the antenna, and detect a phase-difference between the first and second phases to generate a detection phase-difference signal;

a delay line configured to delay the second transmitting signal from the second transmitting circuit to the antenna, and delay the antenna reflection signal from the antenna to the receiving circuit; and a circulator configured to circulate the delayed antenna reflection signal to the receiving circuit, and circulate the second transmitting signal from the second transmitting circuit to the delay line and the receiving circuit;

a selecting circuit configured to select one of the phase detection circuit and the transmitting circuit and connect the selected one of the phase detection circuit and the transmitting-circuit to the antenna; and a control circuit configured to controls the selecting circuit to receive the detection phase-difference signal and the power detection signal, and control the impedance matching circuit to set the variable impedance depending on the detection phase-difference signal and the power detection signal.

According to yet another aspect of the invention, there is provided a radio communication equipment comprising;

a power supply configured to supply an electric power;

a transmitting circuit configured to generate a transmitting signal, having a first phase, which is energized by the power supply;

a power detection circuit configured to detect the electric power supplied to the transmitting circuit and generate a power detection signal;

an antenna, having an antenna impedance, to which a first transmitting signal is supplied, and which generates an antenna reflection signal having a second phase depending on the transmitting signal;

an impedance matching circuit configured to adjust the antenna impedance to match the antenna with the transmitting circuit;

a receiving circuit configured to receive the transmitting signal from the transmitting circuit and the antenna reflection signal from the antenna, and detect a phase-difference between the first and second phases to generate a detection phase-difference signal;

a delay line configured to delay the transmitting signal from the transmitting circuit to the antenna, and delay the antenna reflection signal from the antenna to the receiving circuit; and a circulator configured to circulate the delayed antenna reflection signal to the receiving circuit, and circulate the transmitting signal from the second transmitting circuit to the delay line and the receiving circuit;

a selecting circuit configured to select one of the delay line and the circulator and connect the selected one of the delay line and the circulator to the antenna; and a control circuit configured to controls the selecting circuit to receive the detection phase-difference signal and the power detection signal, and control the impedance matching circuit to set the is variable impedance depending on the detection phase-difference signal and the power detection signal.

According to still further aspect of the invention, there is provided a radio communication equipment comprising;

a power supply configured to supply an electric power;

a first transmitting circuit configured to generate a first transmitting signal having a first frequency, which is energized by the power supply;

a power detection circuit configured to detect the electric power supplied to the first transmitting circuit and generate a power detection signal;

an antenna, having an antenna impedance, to which a first transmitting signal is supplied;

an impedance matching circuit, configured to adjust the antenna impedance to match the antenna with the first transmitting circuit;

a phase detection circuit, including;

a second transmitting circuit configured to generate a second transmitting signal having a first phase and a second frequency, and supply the second transmitting signal to the antenna, the antenna generating an antenna reflection signal having a second phase depending on the second transmitting signal:

a receiving circuit configured to receive the second transmitting signal from the second transmitting circuit and the antenna reflection signal from the antenna, and detect a phase-difference between the first and second phases to generate a detection phase-difference signal;

a delay line configured to delay the second transmitting signal from the second transmitting circuit to the antenna, and delay the antenna reflection signal from the antenna to the receiving circuit; and a circulator configured to circulate the delayed antenna reflection signal to the receiving circuit, and circulate the second transmitting signal from the second transmitting circuit to the delay line and the receiving circuit;

a filter circuit configured to pass the first and second transmitting signal to the antenna and the antenna reflection signal to the phase detection circuit, respectively, and prevent the antenna reflection signal from being transferred to the first transmitting circuit; and a control circuit configured to controls the control the impedance matching circuit to set the variable impedance depending on the detection phase-difference signal and the power detection signal.

According to furthermore still aspect of the invention, there is provided a method of adjusting a variable impedance in an impedance matching circuit connected to an antenna, comprising:

supplying an electric power to generate a transmitting signal;

supplying the transmitting signal to the antenna through the impedance matching circuit;

detecting a antenna reflection signal having a phase, which is returned from the antenna;

detecting the electric power; and comparing the phase detected and the power detected with a reference phase and a reference power to set the variable impedance of the impedance matching circuit.

DETAILED DESCRIPTION OF THE INVENTION

There will be described embodiments of the present invention with reference to the accompanying drawings.

Figure 1:
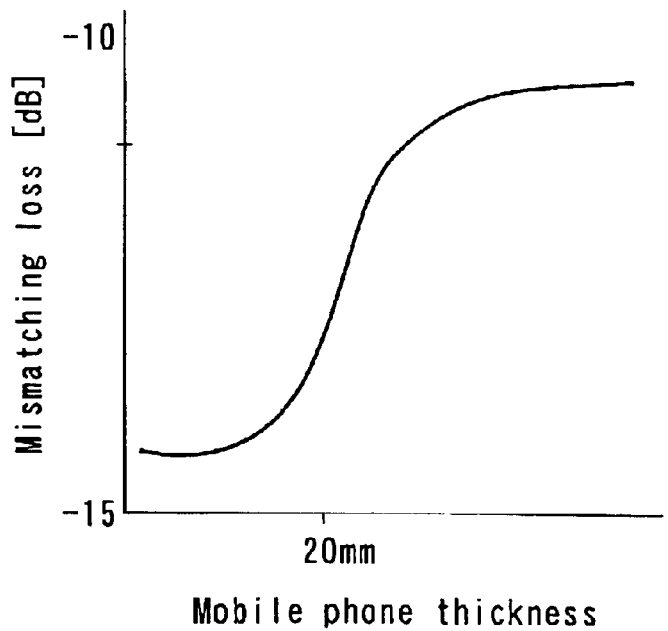
FIG. 1 is a graph showing the relation between the thickness of a mobile phone and the mismatching loss of an antenna.
Figure 2:
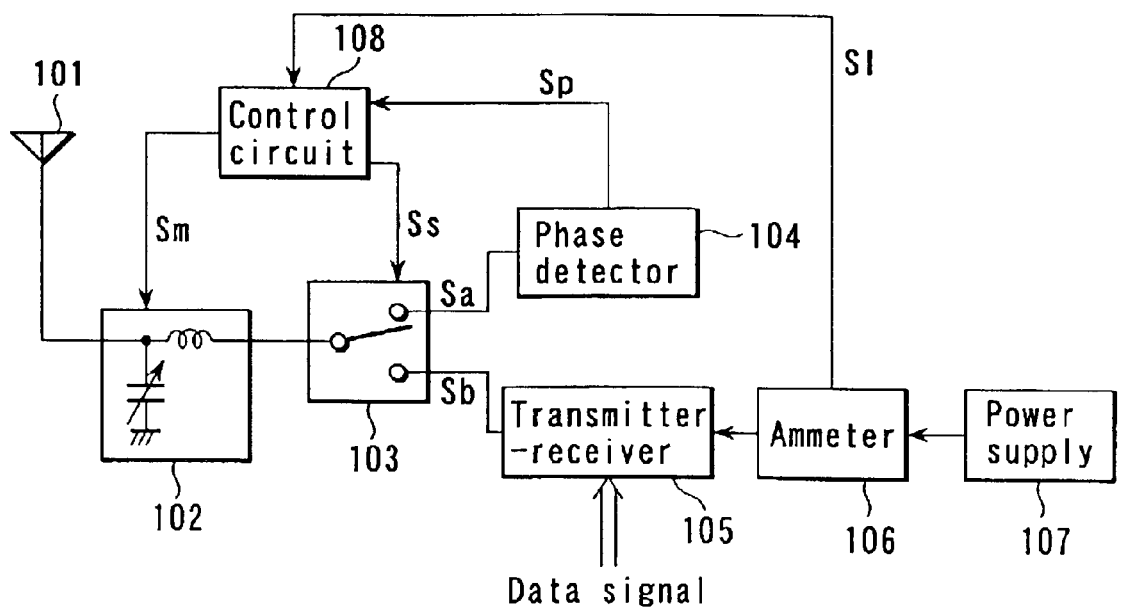
FIG. 2 is a block diagram showing schematically a circuit configuration of a radio equipment of portable type according to one embodiment of the present invention.

FIG. 2 is a block diagram showing a radio equipment of portable type according to one embodiment of the present invention.

As shown in FIG. 2, an antenna 101 is connected to is a matching circuit 102 having the function of matching the impedance of an antenna. The matching circuit 102 is connected to a changeover switch 103. One end of the changeover switch 103 is connected to a reflection phase detector 104 for detecting the phase of the reflection signal reflected by the antenna, and the other end is connected to a transmitter-receiver 105 for generating a transmitting signal.

The transmitter-receiver 105 is connected to a power supply 107 through an ammeter 106 for detecting the current value of the supply power. A control-circuit 108 is connected to the reflection phase detector 104 and ammeter 106, receiving a phase signal and a current signal detected by the detector 104 and ammeter 106. The control circuit 108 sends a control signal to the matching circuit 102 and changeover switch 103, controlling these circuits.

Here, the matching circuit 102, comprising an inductance and a variable capacitance element, can change the impedance value of the antenna 101 when the variable capacitance element is varied by the control signal from the control circuit 108.

The reflection phase detector 104, containing a transmitting circuit (not shown), measures what extent the antenna 101 changes the phase of the signal transmitted from the inside transmitting circuit (not shown), by receiving the signal reflected by the antenna. As already described, the reflection signal from the terminal of the antenna 101 is changed by the circumstances around the antenna 101. This change in the reflection signal is as already explained with the prior art is generated based on the antenna impedance change, and can be considered equivalent to the impedance change. Therefore, if the correlation between the reflection phase Sp and the state of the antenna 101 is previously examined, it is possible to know the state of the antenna by the value of the reflection phase Sp from the antenna 101. It is also possible to determine the method of adjusting the matching circuit 102 by the measured reflection phase Sp, in order to return the reflection phase Sp to a reference level. Namely, by detecting the reflection signal from the antenna 101, the impedance of the antenna 101 can be estimated. If the value of the variable capacitance element of the matching circuit 102 is changed based on the impedance of the antenna 101, the transmission power can be held optimum.

The power supply circuit 107 powers the transmitter-receiver 105. The supplied power is modulated based on the digital data signal, e.g., audio and video signals, sent from a data signal generator (not shown), and it is converted also to a transmission frequency, thereby a transmitting signal is generated and transmitted from the antenna 101. The antenna 101 transmits a transmitting signal into the air, but a part of the signal returns to the transmitter-receiver 105 as a reflected wave. The reflection quantity of this reflected signal changes depending on the impedance value of the antenna 101.

The impedance of the antenna 101 is changed by the circumstances surrounding the antenna, and the returned reflection signal is also changed. This reflection signal changes the gain and efficiency of the transmitting amplifier in the transmitter-receiver 105. Therefore, the fluctuation in this reflection signal causes a fluctuation in the current consumption of the transmitter-receiver 105. An ammeter 106 measures the fluctuation in the current consumption, and a current level SI is sent to the control circuit 108. The value of this current level SI is closely related to the situation in which the antenna is placed. Therefore, the current level SI can be used as an evaluation function for adjustment of the matching circuit.

The signal received by the antenna 101 is supplied to the transmitter-receiver 105 through the matching circuit 102 and changeover switch 103. Processing of the received signal is equivalent to ordinary processing of a mobile terminal or at a base station, and detailed explanation will be omitted.

Figure 3:
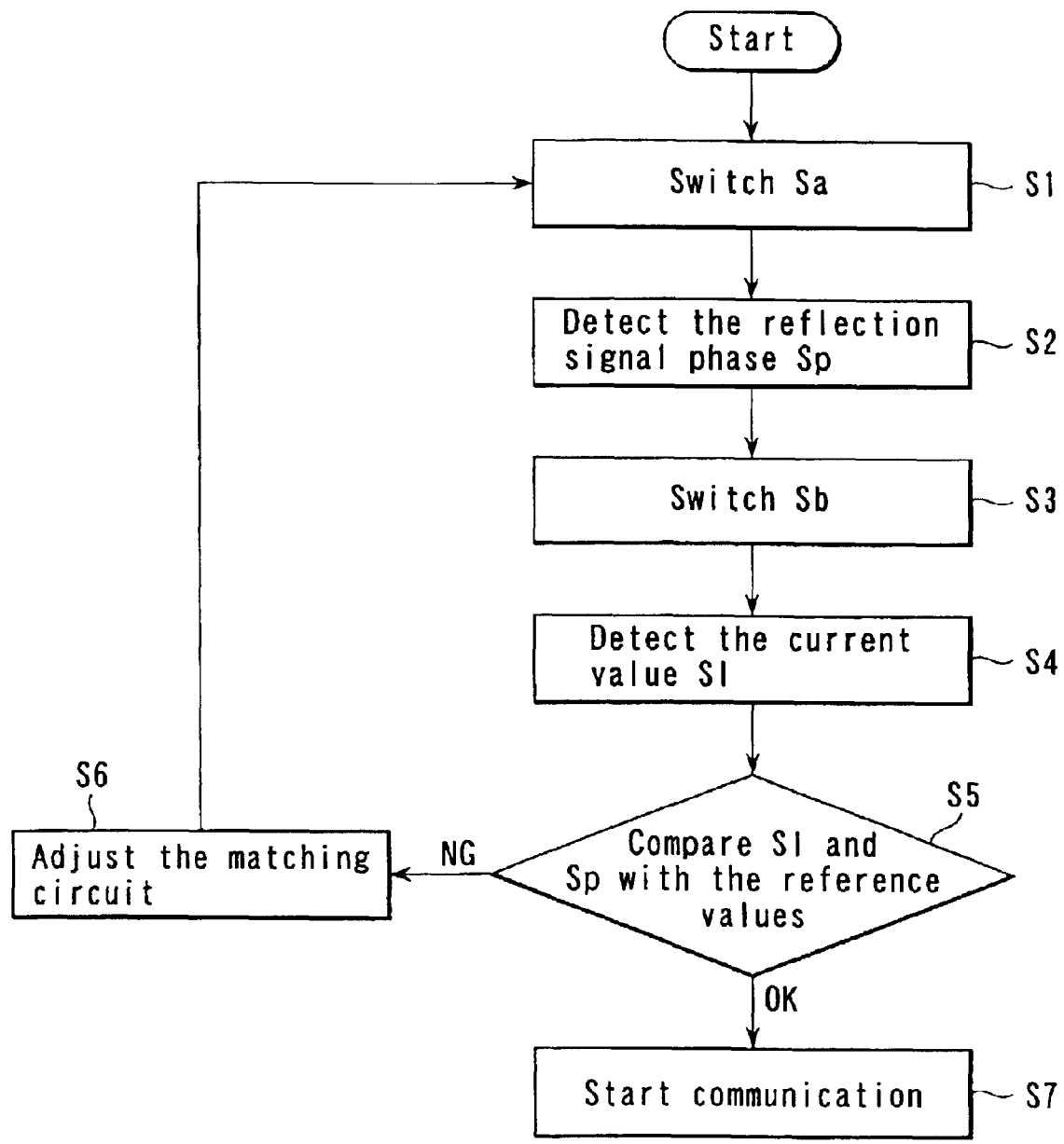
FIG. 3 is a flow chart showing the operations of the radio equipment of portable type shown in FIG. 1.

There will now be described the operations of the control circuit 108 with reference to the flow chart of FIG. 3.

First, receiving the control signal from the control circuit 108, the movable contact of the switch 102 is connected to a first fixed contact Sa, setting a phase detection mode to detect the phase of the reflection signal (step S1). Next, the transmitting circuit (not shown) of the phase detector 104 sends a phase detection signal to the control circuit 108, detecting the phase Sp of the reflection signal from the antenna 101 (step S2).

Next, the movable contact of the switch 102 is connected to a second fixed contact Sb, setting a current detection mode for detecting a transmission current (step S3). Therefore, the transmission power is supplied to the transmitter-receiver 105, the transmitting signal is supplied from the transmitter-receiver 105 to the antenna 101, and the ammeter 106 detects the current level SI of the power supplied to the transmitter-receiver 105 (step S4). The phase Sp and the current level SI of this reflection signal are given to the control circuit 108, where Sp and SI are compared to the reference values Sp0 and SI0 (step S5). The reference values Sp0 and SI0 are previously measured under the condition where the antenna 101 is not being close to the surrounding things, and the measurement value is stored in the storage circuit. When the phase Sp and current level SI are deviated from the previously determined reference values Sp0 and SI0, respectively, the matching circuit 102 is adjusted. (Step S6) After this adjustment, the phase Sp and current value SI of the reflection signal will be measured in the same way, and the evaluation of these two values will be repeated. The adjustment and measurement will be repeated until the values of Sp and SI reach the reference values Sp0 and SI0, respectively. When the values of Sp and SI reach the reference values Sp0 and SI0, respectively, communication will be started in transmitting/receiving mode by utilizing the transmitter-receiver 105 (step S7).

Since communication is started after the antenna impedance is set to the optimum level, as described above, the influence of the circumstances upon the mobile terminal operation is eliminated and communication can be started in an optimum state.

Figure 4:
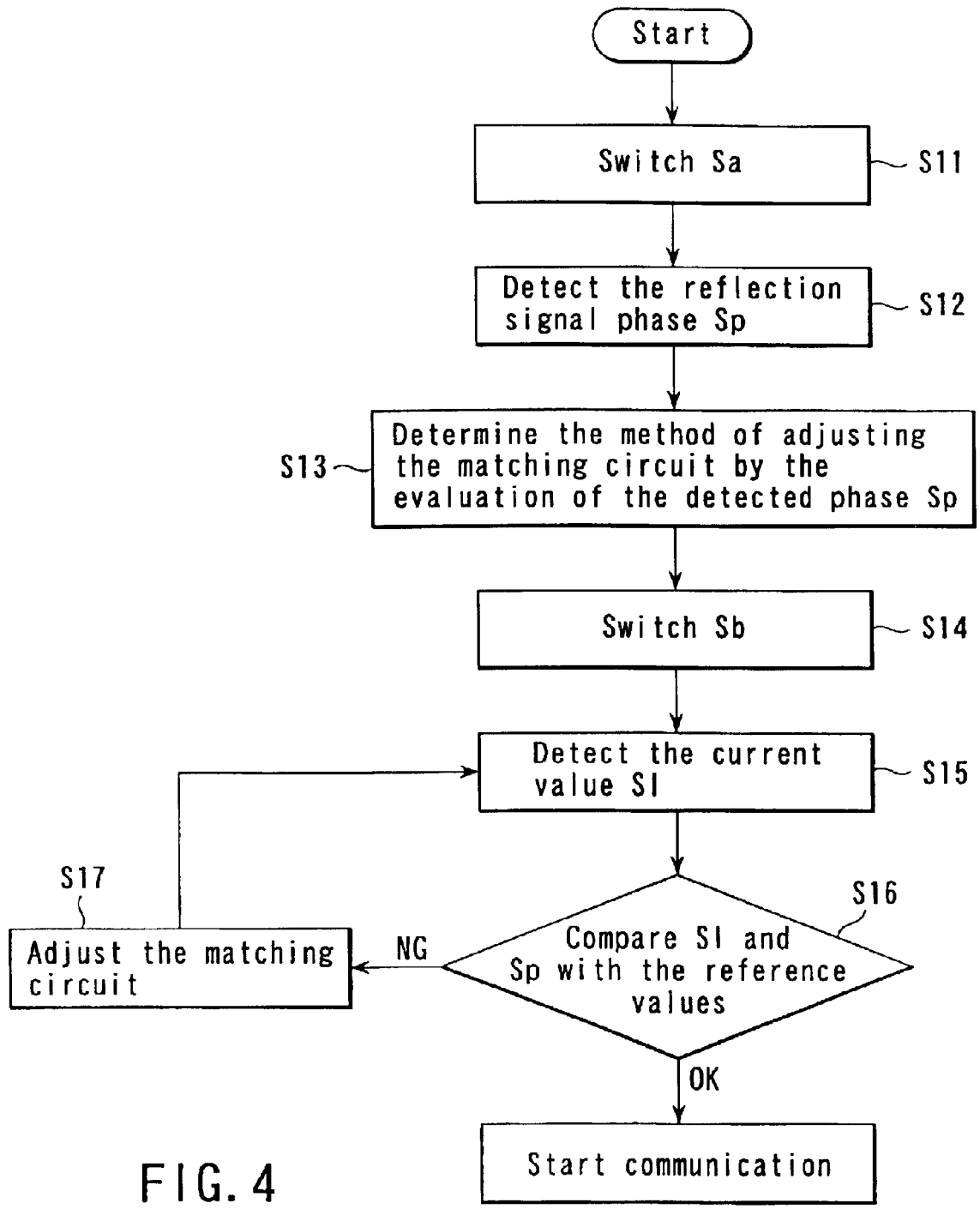
FIG. 4 is another flow chart showing the operations of the radio equipment of portable type shown in FIG. 1.

Next, another control method in the circuit shown of FIG. 2 will be explained with reference to the flow chart shown in FIG. 4. First, the movable contact of the switch 102 is connected to a fixed contact Sa by the control signal from the control circuit 108, and phase detection mode is set to detect the phase of the reflection signal (step S11). Next, a transmitting signal is transmitted from the transmitting circuit (not shown) in the phase detector 110, the reflection signal from the antenna 101 is detected, and the phase Sp of the reflection signal is detected (step S12).

Next, a method of adjusting the matching circuit 102 is determined based on the value of the detected phase Sp (step S13). In step 13, when comparing the current level Sp to the reference value Spa, the method of adjusting the capacitance element of the matching circuit depending on the phase shift value Sp, that is, whether to increase or decrease the capacitance is determined. When the phase Sp of the reflection signal is largely shifted depending upon the design of the amplifier which comprises the transmitter-receiver, the value of the capacitance element of the matching circuit is increased or decreased to approximate the value Sp to the reference value. Whether to increase or decrease the capacitance, is determined.

After the adjustment method is determined, the movable contact of the switch 103 is connected to a second fixed contact Sb, and phase detection mode is set to detect the phase of the reflection signal (step S14). Next, the current level SI is detected by the ammeter 106 (step S13). The current level SI is compared to the reference value SI0 (step S16). This reference value SI0 is, as explained above, is previously measured under the condition where the antenna 101 is not close to the surrounding things, and the measurement value is stored.

When the current level SI is shifted from the reference value SI0, the matching circuit 102 is adjusted (step S17). Measurement of the current value SI and evaluation will be repeated until the current level SI reaches the reference value SI0. When the current level SI reaches the reference value, communication will be started in transmitting/receiving mode by utilizing the transmitter-receiver 105 (step S18).

Figure 5:
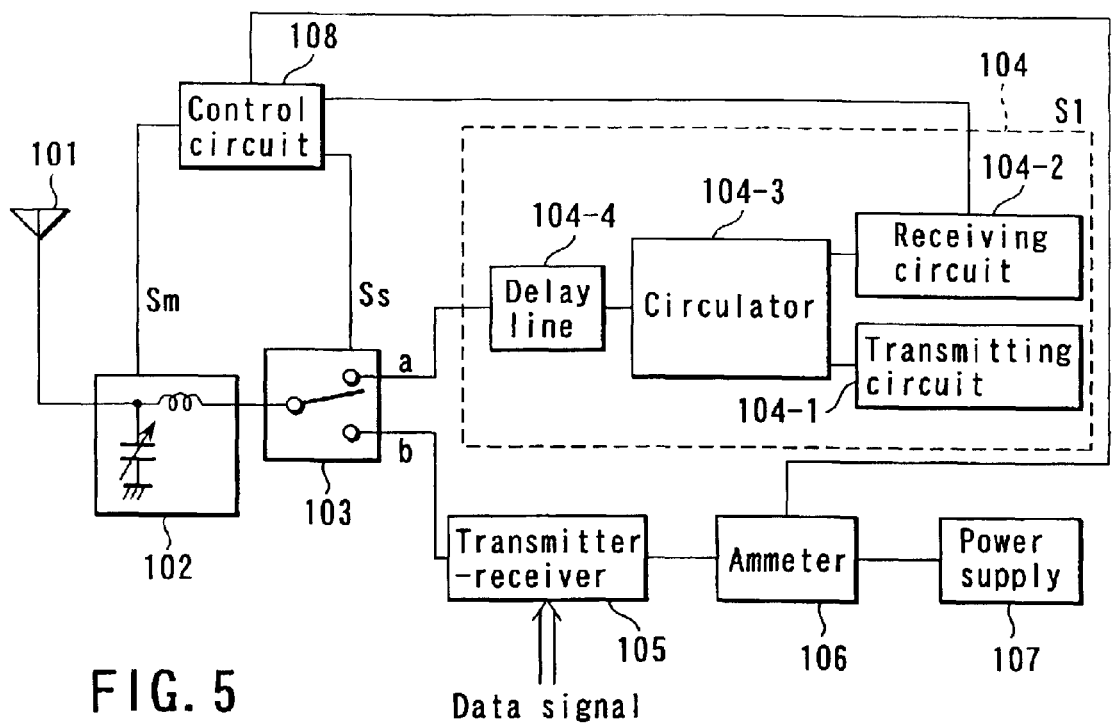
FIG. 5 is a block diagram showing schematically a circuit configuration of a radio equipment of portable type according to another embodiment of the present invention.

Therefore, in such control, only the current value SI is used as an evaluation function for adjusting the matching circuit 102. Accordingly, the time required by the adjustment can be reduced. As explained hereinbefore, the above-mentioned embodiment improves the communication performance of a mobile terminal when an antenna comes close to the surrounding things including a human body. FIG. 5 shows the configuration of the phase detector 104 of a radio equipment of portable type shown in FIG. 2. The blocks except the phase detector 104 are the same as those in FIG. 2, and the explanation thereof will be omitted.

As shown in FIG. 5, the phase detector 104 is provided with a transmitting circuit 104-1 which transmits a signal for measuring the phase of the reflection signal, and a receiving circuit 104-2 which receives the reflection signal as a reflected wave reflected by the antenna 101. The transmitting circuit 104-1 and the receiving circuit 104-2 are connected to a circulator 104-3. The circulator 104-3 is connected to a switch 103 through a delay line 104-4.

The transmitting circuit 104-1 and the receiving circuit 104-2 include a phase modulator/demodulator. The circulator 104-3 sends the transmitting signal Si from the transmitting circuit 104-1 to the receiving circuit 104-2, sends the transmitting signal generated-from the transmitting circuit 104-1 to the antenna 101 through the delay line 104; and supplies the reflection signal reflected by the antenna 101 to the receiving circuit 104-2 through the delay line 104-4. Namely, the circulator 104-3 selectively supplies the receiving circuit 104-2 with the transmitting signal from the transmitting circuit 104-1 and the reflection signal from the antenna 101. Further, the delay line 104-4 uses an element such as an acoustic surface-wave filter 10 to give a relatively long delay to the transmitting signal going to the antenna 101 and the reflection signal coming from the antenna.

Figure 6:
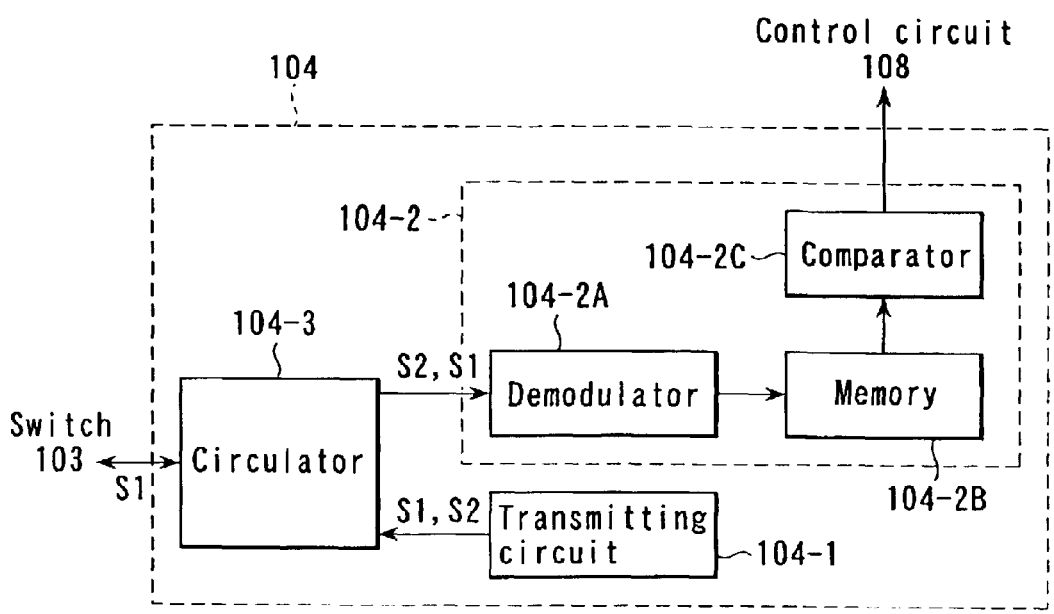
FIG. 6 is a block diagram showing the exemplary structure of the receiving circuit shown in FIG. 5.

The receiving circuit 104-2 has the structure as shown in FIG. 6. The receiving circuit 104-2 includes a demodulator 104-2A which detects the transmitting signal or the reflection signal from the circulator 104-3, and demodulates them. The phase of the transmitting signal or the reflection signal demodulated by this de modulator 104-2A is stored as phase data in the storage circuit 104-2B. The stored phase data of the demodulated transmitting signal and reflection signal is sent to the comparator 104-2C, where the phase-difference between the two signals is detected. The detected phase-difference signal is supplied to the control circuit 108.

Figure 7:
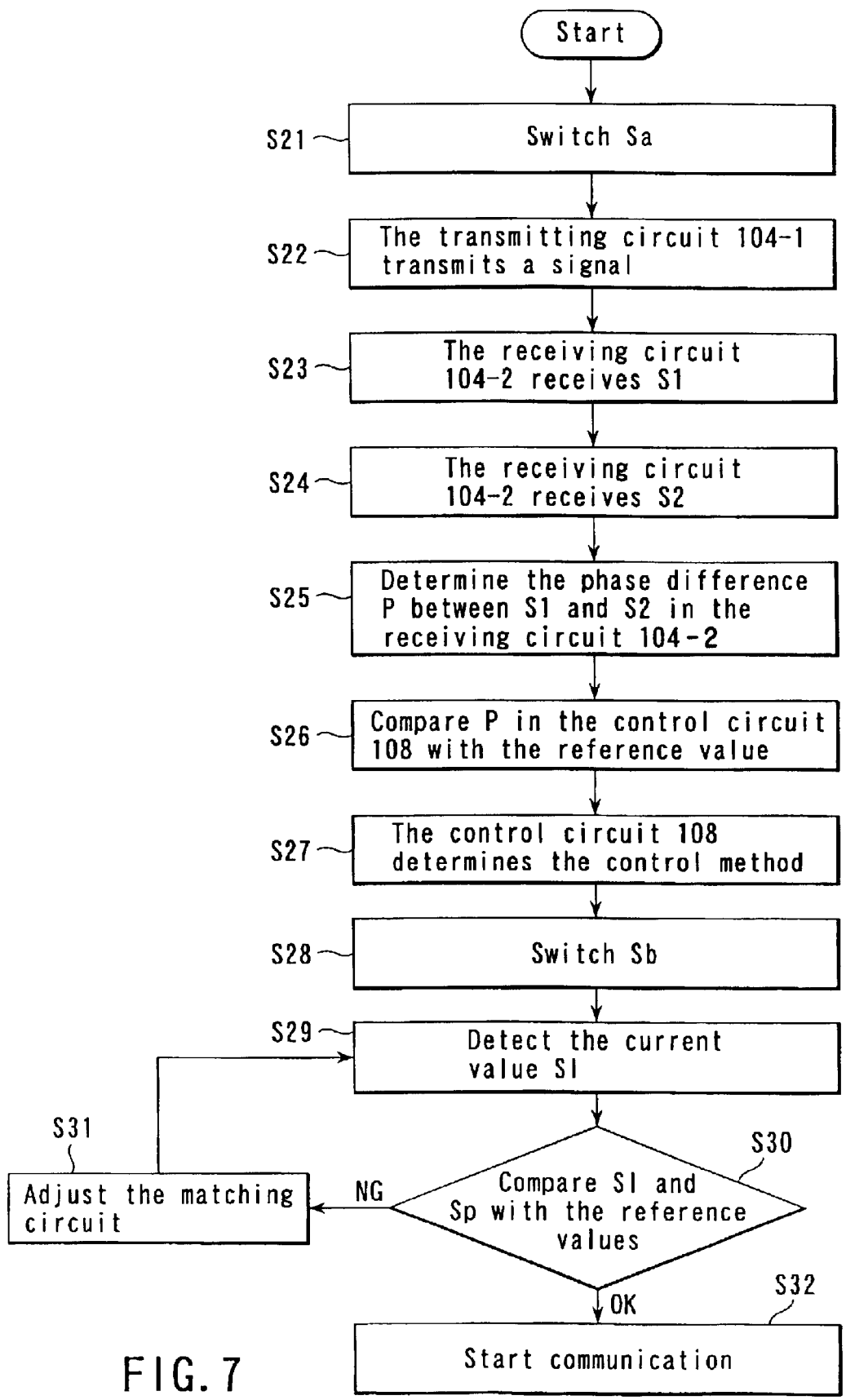
FIG. 7 is a flow chart showing the operations of the radio equipment of portable type shown in FIGS. 5 and 6.

Description will now be given on the operations of the receiving circuit 104 and the control circuit 108 which have the phase detection function shown in FIG. 5 and FIG. 6, with reference with the flow chart of FIG. 7. In a first step, the phase is detected in free space of the antenna 101 in order to determine a reference value of the phase. The following operations are executed under the condition where no things come close to the antenna.

First, the movable contact of the switch 102 is connected to the fixed contact Sa by the control signal from the control circuit 108, and phase detection mode is set to detect the phase of the reflection signal (step S21). Next, a transmitting signal is transmitted from the transmitting circuit 104-1. At this time, the signal is non-modulated, and the pulse width is fixed to be ½ or lower than the delay time of the delay line 104-4.

The circulator 104-3 is previously adjusted, so that a part of the transmitted signal, that is, the transmitting signal S1 is sent directly to the receiving circuit 104-2 and the remainder, that is, the transmitting signal S2 is sent to the delay line 104-4. The receiving circuit 104-2 detects and demodulates the transmitting signal S1, and collects the phase data pl of that signal, and starts measuring the time passing after the start of receiving the transmitting signal S1 (step S23)

The transmitting signal S2 sent to the delay line 104-4 is transmitted to the antenna 101 through the-delay line 104-4, the switch 103 and the matching circuit 102. The transmitting signal is reflected by the antenna 102 according to the impedance difference between the antenna 101 and the matching circuit 102. This reflected signal S2 is returned to the circulator 104-3 through the matching circuit 102, the switch 103 and the delay line 104-4. The reflected signal is applied to the receiving circuit 104-2 by the circulator 104-3. The receiving circuit 104-2 detects and demodulates the reflected signal S2, thereby obtaining the phase data P2 of the reflected signal S2 (step S24).

To confirm the reflected signal S2, the time measured after reception of the transmitting signal S1 is used. Namely, the back-and-fourth delay time given by the delay line 104-4 is previously measured. The input signal to be received after that delay time is judged to be the reflection signal S2 reflected by the antenna. As the signal 52 is delayed by the delay line 104-4, interference will not occur between the transmitting signal SI and the reflection signal S2.

The comparator 104-2C compares the phase data P1 of the transmitting signal S1 with the phase data P2 of the reflection signal S2, and sends the phase-difference data P to the control circuit 108. The control circuit 108 stores in the memory this phase-difference data P indicating the state of the antenna in free space as a reference (step S25).

As described above, the reference is determined.

Next, a measurement sequence will be described in an actual condition or environment. A method of measuring a phase in the actual condition is the same as the method of measuring the reference. Thus, procedures in the actual phase measuring method are the same as that of the steps S21 to S25. Thus, description of the procedures will be omitted.

In the actual phase measuring method, after the step S26, the control circuit 108 compares the measured phase with the reference value.

Next, the method of adjusting the matching circuit 102 is determined based on the phase Sp of the detected reflection signal (step S27). As already explained, this method determines a method of adjusting the capacitance element in the matching circuit according to the phase of the reflection signal when comparing the current value with the reference value, namely, whether to increase or decrease the capacitance. When the phase shift of the reflection signal is largely depending upon the design of the amplifier which comprises the transmitter-receiver, the value of the capacitance element of the matching circuit is increased or decreased to approximate the current value to the reference value. Whether to increase or decrease the capacitance is determined.

After the adjustment method is determined, the movable contact of the switch 103 is connected to the fixed contact Sb, and current detection mode is set to detect the transmission current (step S28). Next, the current level SI is detected by the ammeter 106 (step S29). The current level SI is compared to the reference value SIG (step S30). This reference value SI0 is, as explained above, is previously measured 25 under the conditions where the antenna 101 is not close to the surrounding things, and the measurement value is stored.

When the current level SI is shifted from the reference value SIO, the matching circuit 102 is adjusted (step S31). Measurement of the current value SI and evaluation will be repeated until the current level SI reaches the reference value SI0. When the current level SI reaches the reference value SI0, communication will be started in transmitting/receiving mode by utilizing the transmitter-receiver 105 (step S32).

As explained above, the communication performance of a mobile terminal when a human body or other surrounding things come close to the antenna, can be improved.

The frequencies used by the phase detector 108 and transmitter-receiver 105 need not to be strictly coincident. The effect of the present invention can be obtained with the similar frequencies.

The reflection phase detector 108 preferably uses a frequency of IMS band (2.4 GHz). With this frequency, a signal to leak from the antenna 101 will not affect other mobile terminals.

Figure 8:
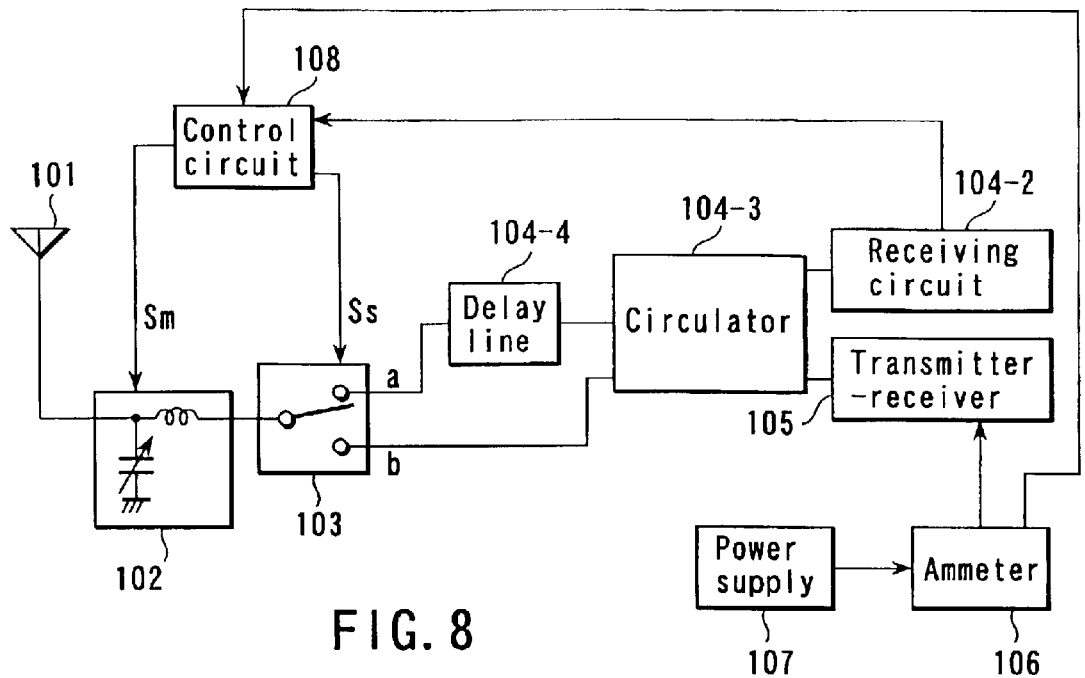
FIG. 8 is block diagram showing schematically a circuit configuration of a radio equipment of portable type according to still another embodiment of the present invention.

FIG. 8 shows the circuit of a portable radio terminal according to still another embodiment of the present invention, in which the transmitter 104-1 comprising the phase detector 104 shown in FIG. 5 is shared by the transmitter-receiver 105. That is, while the impedance of the antenna 101 is being adjusted, the transmitting signal from the transmitter-receiver 105 is used to detect the reflection wave from the antenna.

Figure 9:
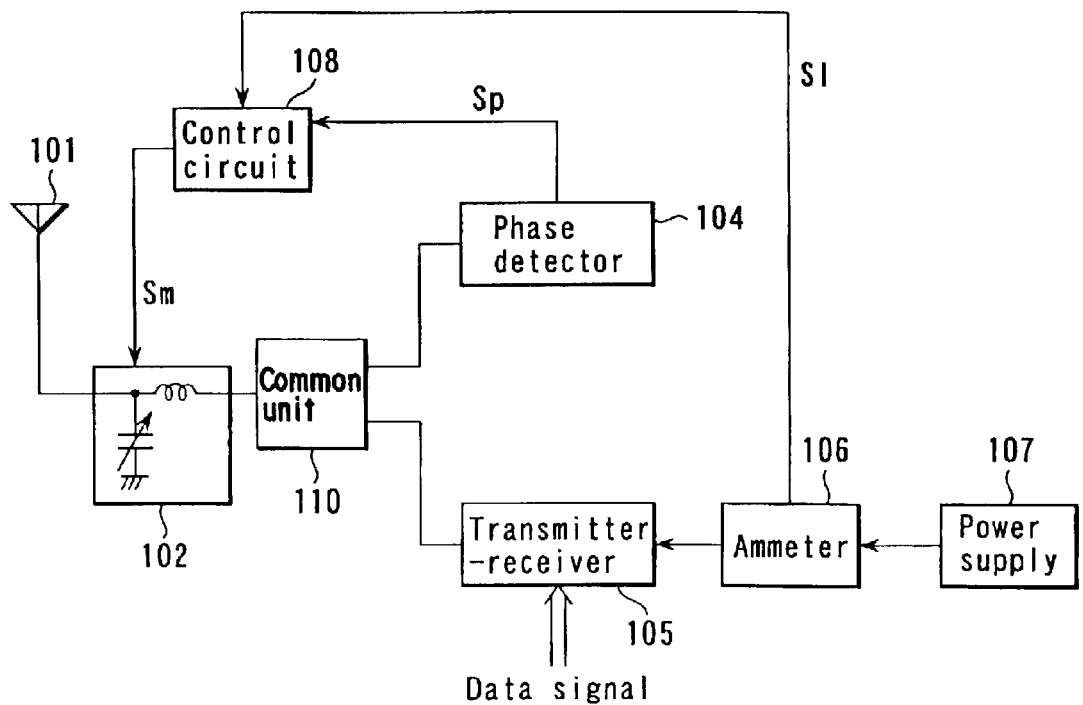
FIG. 9 is a block diagram showing schematically a circuit configuration of a radio equipment of portable type according to a further embodiment of the present invention.

With this circuit configuration, a radio equipment of portable type can be made compact. FIG. 9 shows the circuit of a radio equipment of portable type according to a further embodiment of the present invention. In this circuit, a common unit 110 is used for the switch 102 in the radio equipment of portable type shown in FIG. 2. The common unit 110 is composed of a filter, for example. By making the frequency F1 of the transmitting signal SF1 generated by the phase detector 104 different from the frequency of the transmitting signal SF2 generated by the transmitter-receiver 105, the common unit 110 is given the same function as the switch 102. In other words, since the reflection wave generated by the phase detector 104 and reflected by the antenna has the frequency of SF1, it is prevented from being supplied to the phase detector 104 through the common unit 110. Since the reflection wave generated by the transmitter-receiver 105 and reflected by the antenna has the frequency of SF2, it is prevented from being supplied to the phase detector 104 through the common unit 110. If a radio equipment of portable type in which ISM band (2.4 GHz) is generated by the phase detector 104 is used, it is possible to check the antenna state of the portable radio equipment and to adjust the matching circuit 102 without affecting other radio equipments.

Figure 10:
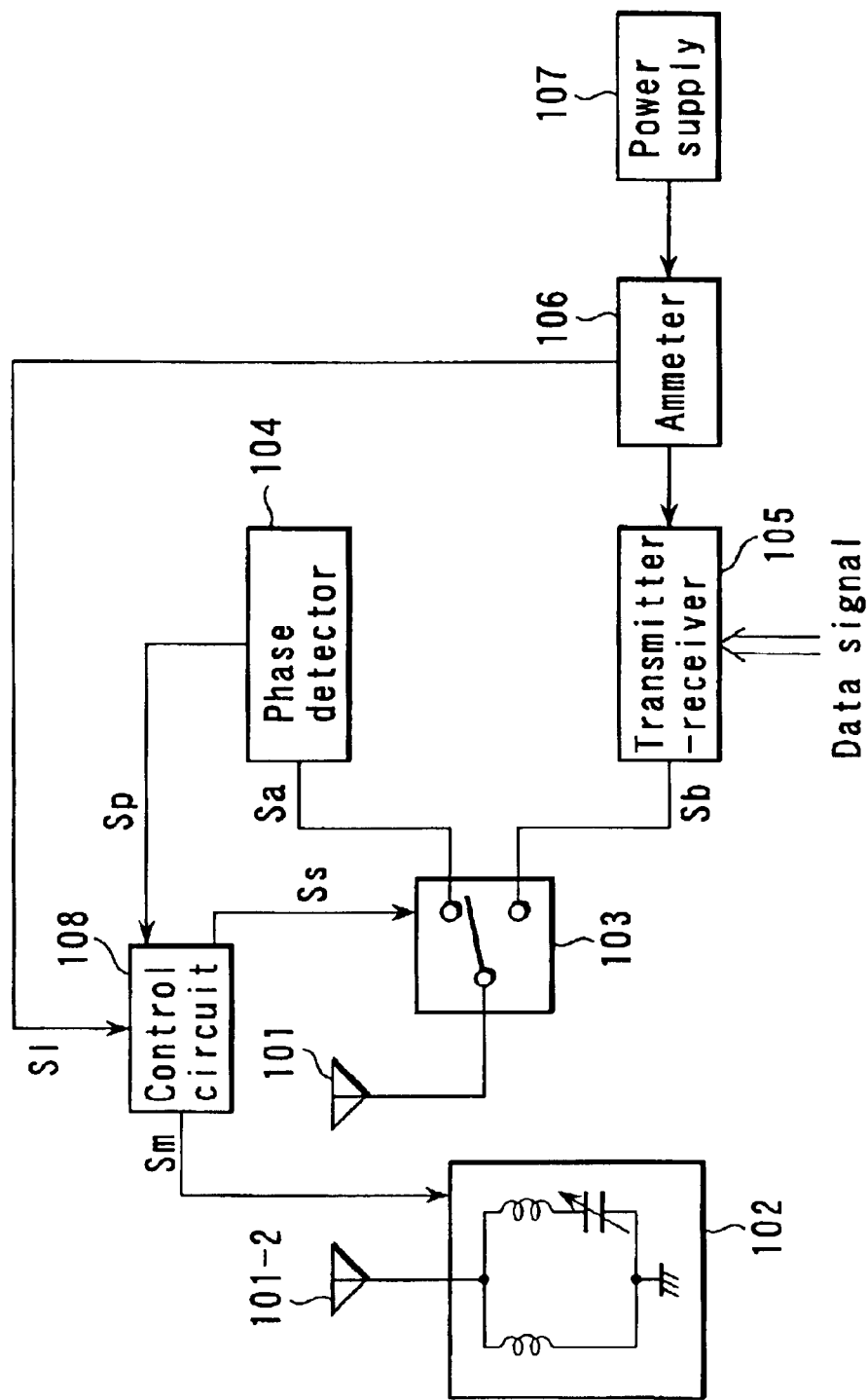
FIG. 10 is a block diagram showing schematically the circuit of a radio equipment of portable type according to a yet further embodiment of the present invention.

Furthermore, FIG. 10 shows a circuit configuration of a radio equipment of portable type according to yet another embodiment of the invention. In FIG. 10, a second antenna 101-2 is provided in addition to the first antenna 101 and a matching circuit 102 is connected between the second antenna 101-2 and the ground, instead of the matching circuit 102 connected between the first antenna 101 and the switch 103. The second antenna 101-2 is so called a parasitic element, which can electro-magnetically coupled to the first antenna 101 under the control of an impedance of the matching circuit 102. If the first and second antennas 101, 102 are coupled each other, the antenna characteristics of the first antennas 101-2 are changed. Accordingly, a good radio communication can be achieved with a suitable antenna characteristics by matching an impedance of the matching circuit 102 under the control of the control section 108, as described in the same manner in the aforementioned embodiments, even if the antenna characteristic of the first antenna 101 shown in FIG. 10 is varied when the first antenna 101 is approached to the human boy. The matching circuit 102 may be located between a base or a tip portion of the second antenna 101-2 and the ground. In this configuration, there is a advantage that the gain is not prevented from being decreased due to the electrical power loss in the matching circuit 102, because the matching circuit 102 is not arrange between the first antenna 101 and the transmitter and receiver 105.

It is apparent that although the above-mentioned embodiment uses a mobile terminal, the present invention is not limited to a mobile terminal and can be applicable to a variety of radio equipments having an antenna, including a radio base station, for example.

Although, the above embodiments employ a single matching circuit, which is a combination of the inductor and the variable capacitor such as a varactor diode whose capacitance is changed in accordance with an applied bias voltage. However, the circuit of the radio equipment may be provided with a plurality of matching circuits each having a fixed capacitor and inductor, and a high frequency switching circuit for switching one of the matching circuits under the control of the control circuit 108. According to this circuit, it is possible to obtain the same advantage as that of the embodiments in which the matching circuit is controlled.

In the embodiments described above, the ammeter 106 is utilized for estimating the electric power supplied to the transmitter-receiver 105, which is drive by a relatively low and substantially constant voltage. If a variable voltage drives the transmitter-receiver 105, instead of the relatively low and substantially constant voltage, it is required to use a power meter for measuring the power supplied to the transmitter-receiver 105, or use not only the ammeter for measuring a current supplied to the transmitter-receiver 105 but also a voltage meter for measuring the voltage applied to the transmitter-receiver 105 and calculate the power from the measured current and voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio communication equipment comprising:
   a power supply configured to supply an electric power;
   a transmitting circuit configured to generate a transmitting signal, said transmitting circuit is configured to be energized by the power supply;
   a power detection circuit configured to detect the electric-power supplied to the transmitting-circuit and generate a power detection signal;
   an antenna having an antenna impedance and configured to receive the transmitting signal and generates an antenna reflection signal having a certain phase depending on the transmitting signal;
   an impedance matching circuit, having a variable impedance, configured to adjust the variable impedance to match the antenna with the transmitting circuit;
   a phase detection circuit configured to detect the phase of the antenna reflection signal from the antenna to generate a phase detection signal;
   a selecting circuit configured to select one of the phase detection circuit and the transmitting circuit, and connect the selected one of the phase detection circuit and the transmitting circuit to the antenna; and
   a control circuit configured to control the selecting circuit to receive the phase detection signal and the power detection signal, and control the impedance matching circuit to set the variable impedance depending on the phase detection signal and the power detection signal.

2. The radio communication equipment according to claim 1, wherein the control circuit is configured to generate first and second selection signals and supply the first and second selection signals to the selecting circuit, the selecting circuit connecting the antenna to the phase detection circuit in response to the first selecting signal, and connecting the antenna to the transmitting circuit in response to the second signal.

3. The radio communication equipment according to claim 1, wherein the control circuit is configured to store a reference phase signal and a reference power signal, and adjust the impedance of the impedance matching circuit in accordance with the comparison between the phase detection signal and the reference phase signal, and between the power detection signal and the reference power signal.

4. The radio communication equipment according to claim 3, wherein the control circuit is configured to determine a method of adjusting the impedance matching circuit depending on the comparison between the phase detection signal and the reference phase signal, and compares the power detection signal with the reference power signal to set the variable impedance in the impedance matching circuit.

5. The radio communication equipment according to claim 4, wherein the adjustment method corresponds to one of increasing and decreasing the variable impedance.

6. The radio communication equipment according to claim 1, further comprising a second antenna connected to the antenna, the first and second antennas being electro-magnetically coupled to each other.

7. A radio communication equipment comprising:
   a power supply configured to supply an electric power;
   a first transmitting circuit configured to generate a first transmitting signal, said first transmitting circuit is configured to be energized by the power supply;

a power detection circuit configured to detect the electric power supplied to the first transmitting circuit and generate a power detection signal;

an antenna having an antenna impedance and configured to receive a first transmitting signal;

an impedance matching circuit configured to adjust the antenna impedance to match the antenna with the first transmitting circuit;

a phase detection circuit, including;

a second transmitting circuit configured to generate a second transmitting signal having a first phase, and supply the second transmitting signal to the antenna, the antenna configured to generate an antenna reflection signal having a second phase depending on the second transmitting signal:

a receiving circuit configured to receive the second transmitting signal from the second transmitting circuit and the antenna reflection signal from the antenna, and detect a phase-difference between the first and second phases to generate a detection phase-difference signal;

a delay line configured to delay the second transmitting signal from the second transmitting circuit to the antenna, and delay the antenna reflection signal from the antenna to the receiving circuit; and a circulator configured to circulate the delayed antenna reflection signal to the receiving circuit, and circulate the second transmitting signal from the second transmitting circuit to the delay line and the receiving circuit;

a selecting circuit configured to select one of the phase detection circuit and the transmitting circuit, and connect the selected one of the phase detection circuit and the transmitting circuit to the antenna; and a control circuit configured to controls the selecting circuit to receive the detection phase-difference signal and the power detection signal, and control the impedance matching circuit to set the variable impedance depending on the detection phase-difference signal and the power detection signal.

8. The radio communication equipment according to claim 7, wherein the control circuit is configured to generates first and second selection signals and supply the first and second selection signals to the selecting circuit, the selecting circuit connecting the antenna to the phase detection circuit in response to the first selecting signal, and connecting the antenna to the first transmitting circuit in response to the second signal.

9. The radio communication equipment according to claim 7, wherein the control circuit is configured to store a reference phase-difference signal and a reference power signal, and adjusts the impedance of the impedance matching circuit in accordance with the comparison between the detection phase-difference signal and the reference phase-difference signal, and between the power detection signal and the reference power signal.

10. The radio communication equipment according to claim 7, wherein the control circuit is configured to determine a method of adjusting the impedance matching circuit depending on the comparison between the detection phase-difference signal and the reference phase-difference signal, and compares the power detection signal with the reference power signal to set the variable impedance in the impedance matching circuit.

11. The radio communication equipment according to claim 10, wherein the adjustment method corresponds to one of increasing and decreasing the variable impedance.

12. The radio communication equipment according to claim 7, further comprising a second antenna connected to the antenna, the first and second antennas being electromagnetically coupled to each other.

13. A radio communication equipment comprising:

a power supply configured to supply an electric power;

a transmitting circuit configured to generate a transmitting signal, having a first phase, said transmitting circuit is configured to be energized by the power supply;

a power detection circuit configured to detect the electric power supplied to the transmitting circuit and generate a power detection signal;

an antenna having an antenna impedance and configured to receive a first transmitting signal and generate an antenna reflection signal having a second phase depending on the transmitting signal;

an impedance matching circuit configured to adjust the antenna impedance to match the antenna with the transmitting circuit;

a receiving circuit configured to receive the transmitting signal from the transmitting circuit and the antenna reflection signal from the antenna, and detect a phase-difference between the first and second phases to generate a detection phase-difference signal;

a delay line configured to delay the transmitting signal from the transmitting circuit to the antenna, and delay the antenna reflection signal from the antenna to the receiving circuit; and a circulator configured to circulate the delayed antenna reflection signal to the receiving circuit, and circulate the transmitting signal from the second transmitting circuit to the delay line and the receiving circuit;

a selecting circuit configured to select one of the delay line and the circulator, and connect the selected one of the delay line and the circulator to the antenna; and a control circuit configured to controls the selecting circuit to receive the detection phase-difference signal and the power detection signal, and control the impedance matching circuit to set the variable impedance depending on the detection phase-difference signal and the power detection signal.

14. The radio communication equipment according to claim 13, wherein the control circuit is configured to generate first and second selection signals and supply the first and second selection signals to the selecting circuit, the selecting circuit connecting the antenna to the delay line in response to the first selecting signal, and connecting the antenna to the circulator in response to the second signal.

15. The radio communication equipment according to claim 13, wherein the control circuit is configured to store a reference phase-difference signal and a reference power signal, and adjust the impedance of the impedance matching circuit in accordance with the comparison between the detection phase-difference signal and the reference phase-difference signal, and between the power detection signal and the reference power signal.

16. The radio communication equipment according to claim 13, wherein the control circuit is configured to determine a method of adjusting the impedance matching circuit depending on the comparison between the detection phase-difference signal and the reference phase-difference signal, and compares the power detection signal with the reference power signal to set the variable impedance in the impedance matching circuit.

17. The radio communication equipment according to claim 13, wherein the adjustment method corresponds to one of increasing and decreasing the impedance.

18. The radio communication equipment according to claim 13, further comprising a second antenna connected to the antenna, the first and second antennas being electromagnetically coupled to each other.

19. A radio communication equipment comprising:

a power supply configured to supply an electric power;

a first transmitting circuit configured to generate a first transmitting signal having a first frequency, said first transmitting circuit is configured to be energized by the power supply;

a power detection circuit configured to detect the electric power supplied to the first transmitting circuit and generate a power detection signal;

an antenna having an antenna impedance and configured to receive a first transmitting signal;

an impedance matching circuit, configured to adjust the antenna impedance to match the antenna with the first transmitting circuit;

a phase detection circuit, including;

a second transmitting circuit configured to generate a second transmitting signal having a first phase and a second frequency, and supply the second transmitting signal to the antenna, the antenna configured to generate an antenna reflection signal having a second phase depending on the second transmitting signal:

a receiving circuit configured to receive the second transmitting signal from the second transmitting circuit and the antenna reflection signal from the antenna, and detect a phase-difference between the first and second phases to generate a detection phase-difference signal;

a delay line configured to delay the second transmitting signal from the second transmitting circuit to the antenna, and delay the antenna reflection signal from the antenna to the receiving circuit; and a circulator configured to circulate the delayed antenna reflection signal to the receiving circuit, and circulate the second transmitting signal from the second transmitting circuit to the delay line and the receiving circuit;

a filter circuit configured to pass the first and second transmitting signal to the antenna and the antenna reflection signal to the phase detection circuit, respectively, and prevent the antenna reflection signal from being transferred to the first transmitting circuit; and a control circuit configured to controls the control the impedance matching circuit to set the variable impedance depending on the detection phase difference signal and the power detection signal.

20. The radio communication equipment according to claim 19, wherein the control circuit is configured to store a reference phase-difference signal and a reference power signal, and adjust the impedance of the impedance matching circuit in accordance with the comparison between the detection phase-difference signal and the reference phase-difference signal, and between the power detection signal and the reference power signal.

21. The radio communication equipment according to claim 19, wherein the control circuit is configured to determine a method of adjusting the impedance matching circuit depending on the comparison between the detection phase-difference signal and the reference phase-difference signal, and compare the power detection signal with the reference power signal to set the variable impedance in the impedance matching circuit.

22. The radio communication equipment according to claim 21, wherein the adjustment method corresponds to one of increasing and decreasing the variable impedance.

23. The radio communication equipment according to claim 19, further comprising a second antenna connected to the antenna, the first and second antennas being electromagnetically coupled to each other.

* * * * *